United States Patent
Humfeld et al.

(10) Patent No.: US 10,454,019 B2
(45) Date of Patent: Oct. 22, 2019

(54) ANISOTROPIC PIEZOELECTRIC DEVICE, SYSTEM, AND METHOD

(71) Applicant: THE BOEING COMPANY, Chicago, IL (US)

(72) Inventors: Keith D. Humfeld, Federal Way, WA (US); Morteza Safai, Newcastle, WA (US)

(73) Assignee: The Boeing Company, Chicago, IL (US)

( * ) Notice: Subject to any disclaimer, the term of this patent is extended or adjusted under 35 U.S.C. 154(b) by 385 days.

(21) Appl. No.: 15/280,096

(22) Filed: Sep. 29, 2016

(65) Prior Publication Data
US 2018/0090669 A1    Mar. 29, 2018

(51) Int. Cl.
*H01L 41/193* (2006.01)
*H01L 41/316* (2013.01)
*H01L 41/314* (2013.01)

(52) U.S. Cl.
CPC .......... *H01L 41/193* (2013.01); *H01L 41/314* (2013.01); *H01L 41/316* (2013.01)

(58) Field of Classification Search
CPC combination set(s) only.
See application file for complete search history.

(56) References Cited

U.S. PATENT DOCUMENTS

| | | | | |
|---|---|---|---|---|
| 2008/0169811 A1* | 7/2008 | Viswanathan | ......... | B82Y 10/00 324/318 |
| 2008/0253057 A1* | 10/2008 | Rijks | ........................ | H01G 5/16 361/281 |
| 2010/0218367 A1* | 9/2010 | Feng | ...................... | H05B 3/145 29/611 |
| 2011/0147715 A1* | 6/2011 | Rogers | .................. | B82Y 10/00 257/24 |
| 2011/0187240 A1* | 8/2011 | Hsu | ...................... | H01L 41/1136 310/367 |
| 2013/0144379 A1* | 6/2013 | Najafi | .................. | A61B 5/0024 623/2.11 |

(Continued)

OTHER PUBLICATIONS

Aubuchon, Joseph F., et al.; "Electric-Field-Guided Growth of Carbon Nanotubes during DC Plasma-Enhanced CVD," Chemical Vapor Deposition, 2006, pp. 370-374, vol. 12.

(Continued)

*Primary Examiner* — Bryan P Gordon
(74) *Attorney, Agent, or Firm* — Sage Patent Group

(57) ABSTRACT

A micro electromechanical (mem) device includes a first electrode, a second electrode, and a shaped carbon nanotube with a first end and a second end. The first end of the shaped carbon nanotube is conductively connected to the first electrode and the second end is conductively connected to the second electrode. A system for making the device includes a plurality of electrodes placed outside the growth region of a furnace to produce a controlled, time-varying electric field. A controller for the system is connected to a power supply to deliver controlled voltages to the electrodes to produce the electric field. A mixture of gases is passed through the furnace with the temperature raised to cause chemical vapor deposition (CVD) of carbon on a catalyst. The sequentially time-varying electric field parameterizes a growing nanotube into a predetermined shape.

22 Claims, 9 Drawing Sheets

(56) References Cited

U.S. PATENT DOCUMENTS

2015/0364670 A1* 12/2015 Ohta ............... H01L 41/1873
310/360

OTHER PUBLICATIONS

Aubuchon Joseph F., et al.; "Multiple Sharp Bendings of Carbon Nanotubes during Growth to Produce Zigzag Morphology," Nano Letters, 2004, pp. 1781-1784, vol. 4.
Baughman, Ray H., et al.; "Carbon Nanotube Actuators," Science, 1999, pp. 1340-1344, vol. 284 (with presentation).
Cassell, Alan M., et al.; "Carbon Nanotube Based Interconnect Technology: Opportunities and Challenges," Micro- and Opto-Electronic Materials and Structures: Physics, Mechanics, Design, Reliability, Packaging, 2007, Chapter 5, pp. 181-204.
Chen, Zhi, et al.; "Fabrication of nanoelectrodes based on controlled placement of carbon nanotubes using alternating-current electric field," Journal of Vacuum Science & Technology B, 2004, pp. 776-780, vol. 22.
Merkulov, Vladimir I., et al.; "Controlled alignment of carbon nanofibers in a large-scale synthesis process," Applied Physics Letters, 2002, pp. 4816-4818, vol. 80.

* cited by examiner

ANISOTROPIC PIEZOELECTRIC DEVICE, SYSTEM, AND METHOD

FIELD

This invention related to artificial piezoelectric materials and devices made from artificial piezoelectric materials. This invention is also related to systems and methods for making such materials and devices.

BACKGROUND

Piezoelectric materials exhibit a phenomenon known as the piezoelectric effect. This effect can be manifested as a change in electrical properties as a result of applied stress or a stress resulting from an applied electric field. Most piezoelectric materials are crystalline in nature.

Crystalline piezoelectric materials can be described as "electrically stiff" in that relatively large amounts of electric field energy are required to change interatomic distances in the material by a relatively small percentage. As an example, maximum deflection for crystalline piezoelectric materials tends to be around 0.5% in a strong field. An example of a relatively strong field might be one of over 100 V/m.

SUMMARY

In at least some embodiments, a micro electromechanical (mem) device includes a first electrode, a second electrode, and a shaped carbon nanotube with a first end and a second end. The first end of the shaped carbon nanotube is conductively connected to the first electrode and the second end of the shaped carbon nanotube is conductively connected to the second electrode.

In at least some embodiments, a system for producing a mem device includes a furnace further including a growth region for carbon nanotubes. The furnace is configured to permit establishment of a controlled, time-varying electric field within the growth region. The system further includes a plurality of electrodes to produce the controlled, time-varying electric field, and a power supply connected to the plurality of electrodes. A controller for the system is connected to the power supply to control the power supply to deliver controlled voltages to the electrodes. These controlled voltages cause the electrodes to produce the controlled time-varying electric field.

In at least some embodiments, a method of making a mem device includes depositing a catalyst on a substrate and placing the substrate with the catalyst in a growth region of a furnace. The temperature of the growth region is raised. A mixture of gases is passed through the furnace, wherein the mixture of gases is tailored to cause chemical vapor deposition (CVD) of carbon on the catalyst. The method further includes sequentially controlling a time-varying electric field within the growth region to parameterize a growing nanotube of carbon into a predetermined shape.

DETAILED DESCRIPTION

Figure 1:
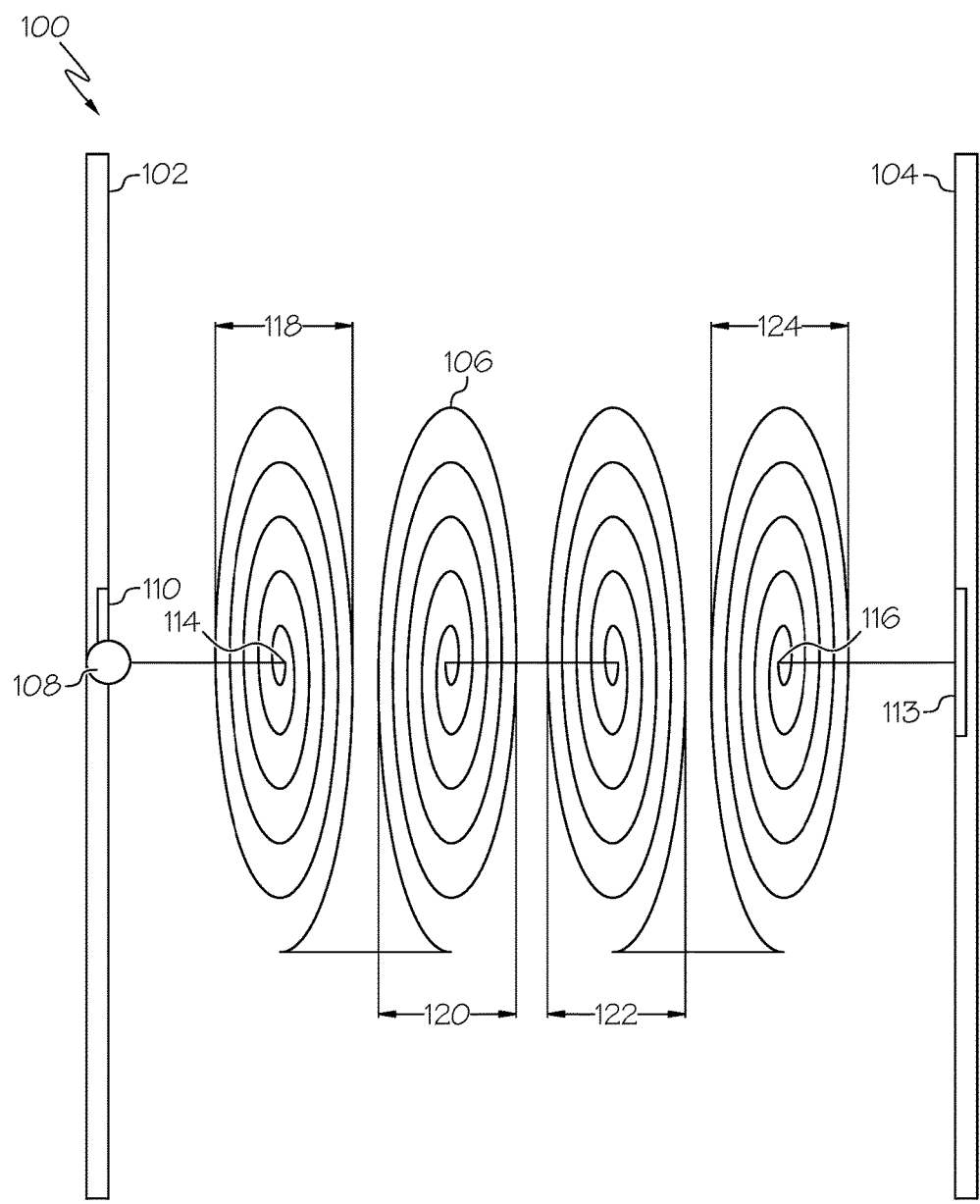
FIG. 1 is a diagram of a mem device according to at least some embodiments.

Embodiments of the invention provide a mem device that has piezoelectric properties. A many-layer stack of these devices is indistinguishable from a solid material. A voltage placed across the material (or set of devices) will cause an expansion of the material in one direction. This expansion can be 100-1600% of the original length. The material is anisotropic; it extends in only one direction. A voltage across a substrate plane will create a current along those substrates without causing the device to change length.

This detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

FIG. 1 is a diagram of a mem device 100 according to example embodiments. A first substrate 102 and a second substrate 104 of material, such as silicon oxide, are separated by a shaped carbon nanotube 106. The nanotube 106 is grown from one or more catalyst particles 108 such that spirals of the nanotube 106 are not physically entangled. Device 100 also includes a first electrode 110 and second electrode 113. The electrodes are conductive paths built into or on the substrates 102 and 104. In some embodiments, the electrodes are copper. The carbon nanotube 106 has a first end 114 conductively connected to the first electrode 110 and a second end 116 conductively connected to the second electrode 113. It should also be noted that the shape of a nanotube according to example embodiments includes at least one spiral. In the example shown in FIG. 1, nanotube 106 includes four spirals, 118, 120, 122, and 124.

The carbon nanotubes (CNTs) in example embodiments are grown under the influence of an electric field that is varied in three dimensions during growth. Carbon nanotubes grow in the direction of an applied electric field. In the case of example embodiments, each carbon nanotube is grown out from the substrate some distance and then is grown into the form of an outward spiral in a plane parallel to the plane of the substrate. Upon reaching a desired outer radius (depending on direction of spiral growth) the nanotube is grown away from the substrate some distance again, then grown into an inward spiral. This may be repeated any number of times. At the end of growth, the nanotube is grown up to and against a second substrate. This second substrate should be conductive either as a whole (such as a metal substrate) or in selected areas to which the nanotubes are grown via use of an electrode as described above. If the substrates are conductive they can serve as the electrodes.

Figure 2:
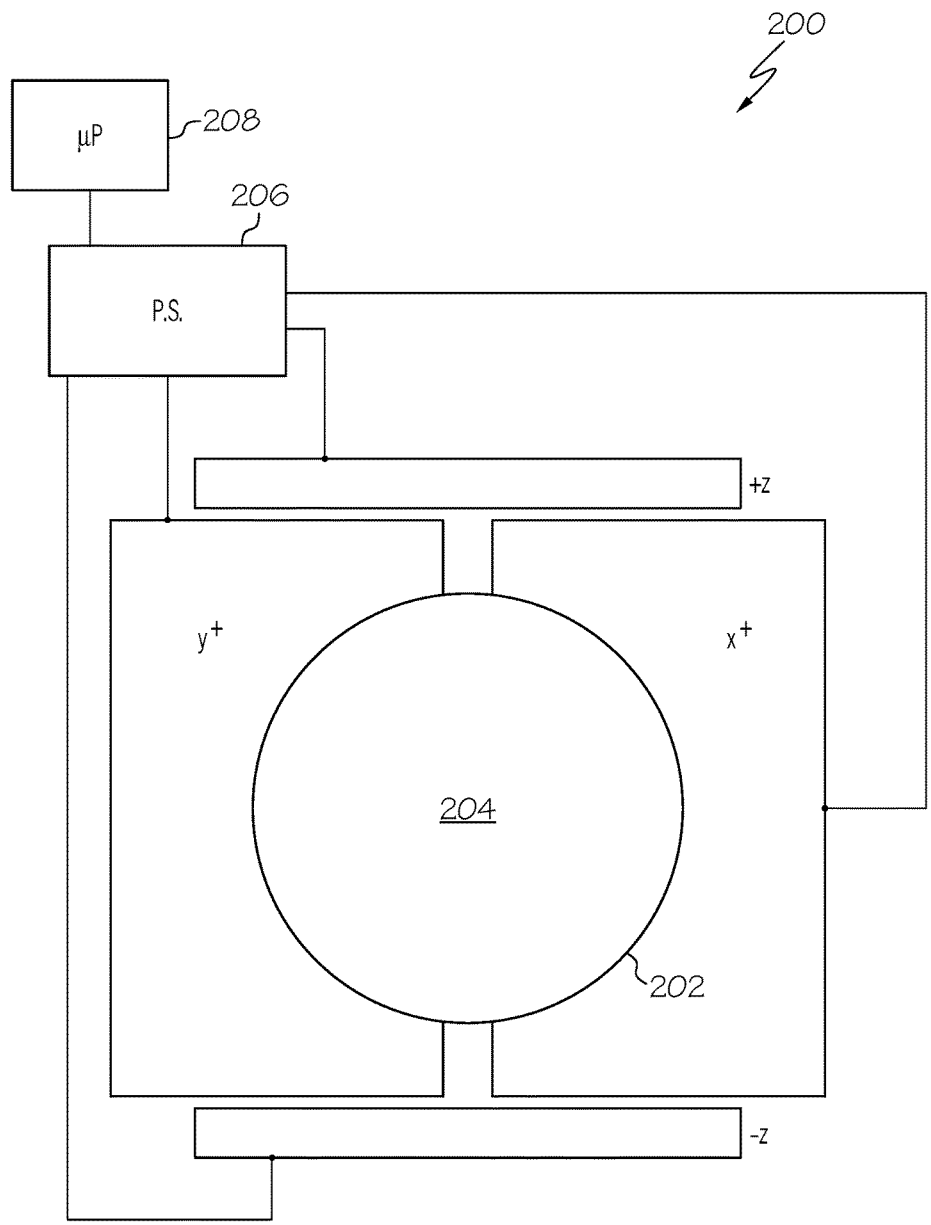
FIG. 2 is an end view of a system for making a mem device like that of FIG. 1.
Figure 3:
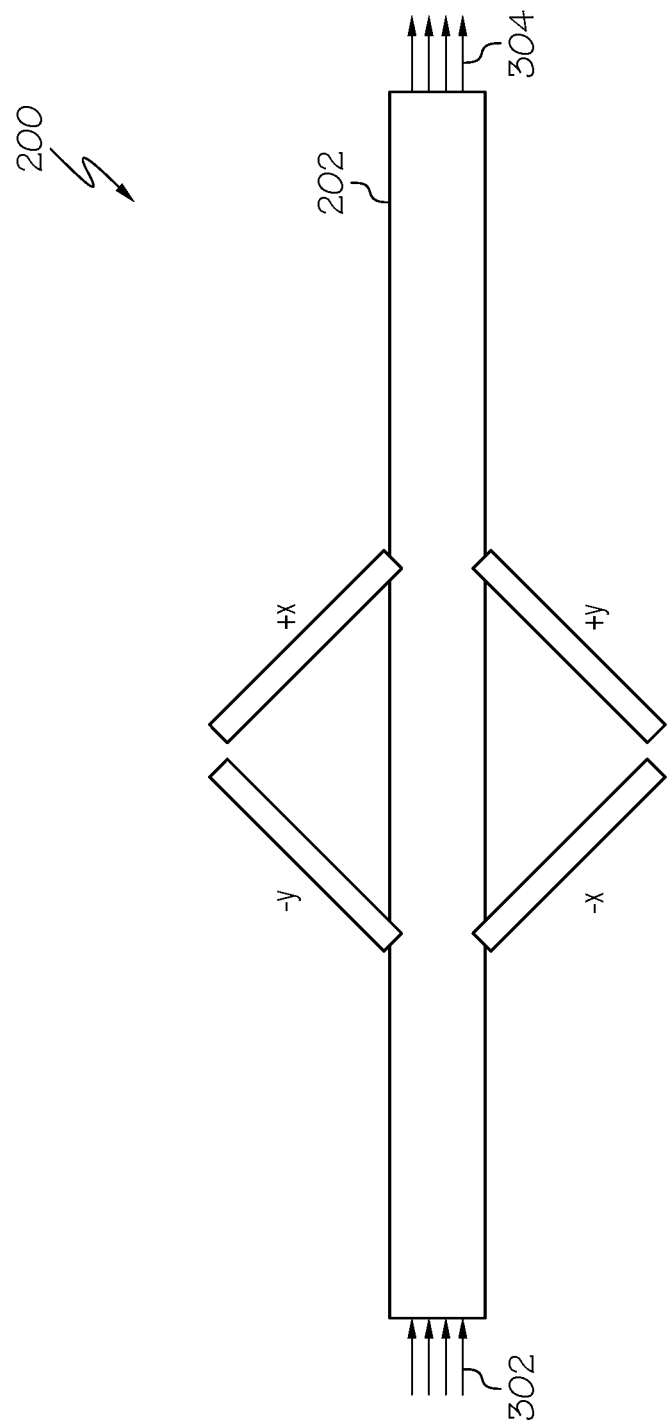
FIG. 3 is a top-down view of a portion of the system of FIG. 2.

FIG. 2 and FIG. 3 show two views of a system 200 for producing a mem device. The system includes a tube furnace 202 further including a growth region 204 for carbon nanotubes. The furnace is configured to permit establishment of a controlled, time-varying electric field within the growth region. The system further includes a plurality of electrodes to produce the controlled, time-varying electric field, and a power supply (P.S.) 206 connected to the plurality of electrodes. A controller (a small microprocessor or "µP") 208 for the system is connected to the power supply 206 to control the power supply 206 to deliver controlled voltages to the electrodes. These controlled voltages cause the electrodes to produce the controlled time-varying electric field.

Still referring to FIG. 2 and FIG. 3, visually in this example embodiment the electrodes essentially form a cube (though the cube could be an imperfect cube), with tube furnace 202 laying diagonally through the cube. These electrodes include three electrode pairs (two electrodes for each pair) positioned and aligned to produce the time-varying electric field by combining three independent, orthogonal, time-varying electric fields. Directions specified herein are relative to each other and are provided for purposes of explaining the drawings and do not necessarily reflect any actual physical orientation of the system or apparatus. The first electrode pair includes the +Z and −Z electrodes, visible only in FIG. 2 and sits over and under the tube furnace centered above and below the growth region. The second electrode pair includes the +X and −X electrodes, which are oriented parallel to each other and are at an angle relative to the axis of the tube furnace. The +X and −X electrodes are in the front and the back of the growth region and between the +Z and −Z electrodes of the first electrode pair. Only the +X, +Y, −Z and +Z electrodes are visible in FIG. 2.

FIG. 3 shows the system 200 with the electronics and the first electrode pair removed for clarity, so that both the +X and −X electrodes are visible in FIG. 3. Also visible in FIG. 3 are both electrodes of a third electrode pair, the +Y and −Y electrodes. These electrodes +Y and −Y are again oriented parallel to each other and are at an angle relative to the axis of the tube furnace. The +Y and −Y electrodes are in the front and the back of the growth region and between the +Z and −Z electrodes of the first electrode pair. The +Y and −Y electrodes are also placed at an angle relative to the +X and −X electrodes of the second electrode pair. In the example embodiment, this angle is about 90 degrees, though the system could be made to work with an imperfect cube shape to the electrodes around the growth region, in which case the angle may have a value other than 90 degrees.

With further reference to FIG. 3, system 200 is configured to allow the passage of gasses into and out of the growth region of tube furnace 202 to enable chemical vapor deposition (CVD) growth of the carbon nanotubes. Gas flow 302 enters tube furnace 202 and gas flow 304 exits tube furnace 202. Gas flow 302 in example embodiments of the invention includes hydrogen, argon and acetylene, and the specifics of this gas flow will be discussed below with respect to FIG. 4. It should also be noted that the growth region of the tube furnace must also be heated in order for CVD to take place. Thus, system 200 includes resistive coils or some other heating mechanism (not shown). The heating mechanism may be controlled by controller 208 or controlled separately.

In some embodiments, a general-purpose processor such as a digital signal processor, microcontroller, controller, or microprocessor (µP) is used and non-transitory firmware, software, or microcode can be stored in a tangible storage medium that is associated with the system or apparatus. Such a medium may be a memory integrated into the processor, may be a memory chip or memory chips that is/are addressed by the processor to perform control functions, or may be a flash drive, magnetic disk drive, or optical disk. Such firmware, software or microcode is executable by the processor and when executed, causes the microcontroller unit to perform its control functions. Such firmware or software could also be stored in or on a tangible medium such as an optical disk or traditional removable or fixed magnetic medium such as a disk drive used to load the firmware or software into a an apparatus of system for maintenance, update, manufacturing, or other purposes. The software causes the processor or controller to control voltages applied to electrodes to produce the electric fields over time to grow carbon nanotubes as described herein. It should be noted that the described control functions could be provided by hard-wired circuitry or an application specific integrated circuit (ASIC) as opposed to a programmed processor or controller. Such hard-wired circuitry or such an ASIC may still be referred to as a "controller."

Figure 4:
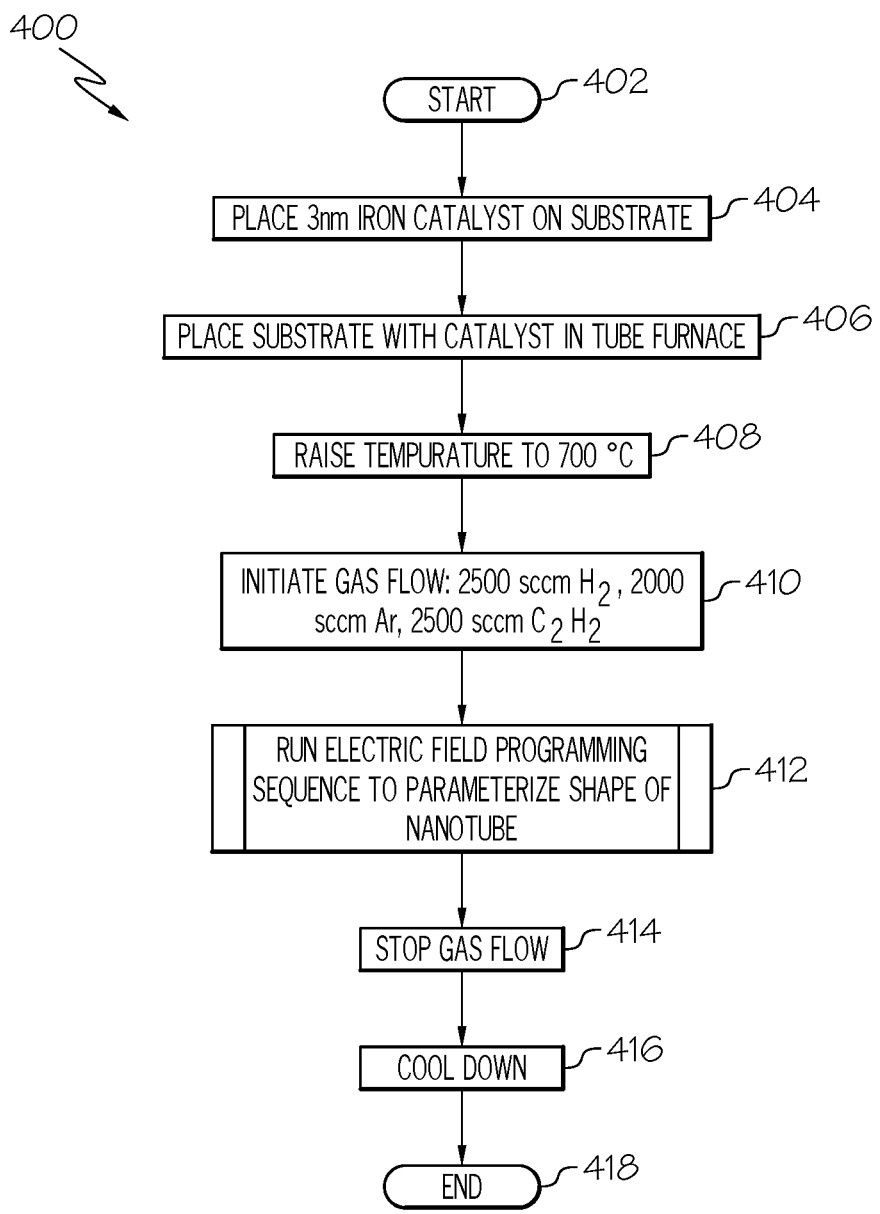
FIG. 4 is a flowchart illustrating a method of making a mem device according to example embodiments.

FIG. 4 is a flowchart illustrating at least a portion of a method or process of making a mem device according to example embodiments. Like most flowcharts, FIG. 4 illustrates the method 400 as a series of conceptual process or sub-process blocks. Process 400 starts at block 402. At block 404, a catalyst is placed on a substrate. In Example embodiments, the catalyst is placed by depositing a 3 nm iron particle using, as examples, lithographic or sputtering techniques. The substrate with the catalyst is then placed in a growth region of a furnace at block 406. The temperature in the growth region is raised at block 408. For a tube furnace with a diameter of about 5 cm temperatures between 600 degrees C. and 800 degrees C. have been found to work. In example embodiments, the temperature is raised to about 700 degrees C. At block 410, a gas flow is initiated to begin passing a mixture of gases through the furnace, wherein the mixture of gases is tailored to cause chemical vapor deposition (CVD) of carbon on the catalyst. For a tube furnace on the order of 5 cm in diameter, the mixture can be created with a flow of hydrogen from 500 to 3000 sccm and of acetylene from 50 to 3000 sccm. Argon is optionally included at a flow rate of up to 2000 sccm. In some example embodiments, the mixture of gasses results from a flow of hydrogen at 2500 sccm, of argon at 2000 sccm, and of acetylene at 2500 sccm.

Still referring to FIG. 4, at block 412, an electric field programming sequence is run to parameterize a shaped nanotube. In the example embodiments presented herein the shape of the nanotube includes a spiral shape. Sub-process 412 includes sequentially controlling the time-varying electric field within the growth region to parameterize a growing nanotube of carbon into the predetermined shape. In example embodiments, using system 200 as previously discussed, the programming sequence controls voltages applied to three electrode pairs positioned and aligned to produce the time-varying electric field with three independent, orthogonal, time-varying electric field components. After the shaped CNT has been produced, gas flow is stopped at block 414, the system cools down at block 416 and the process 400 ends at block 418.

Figure 5:
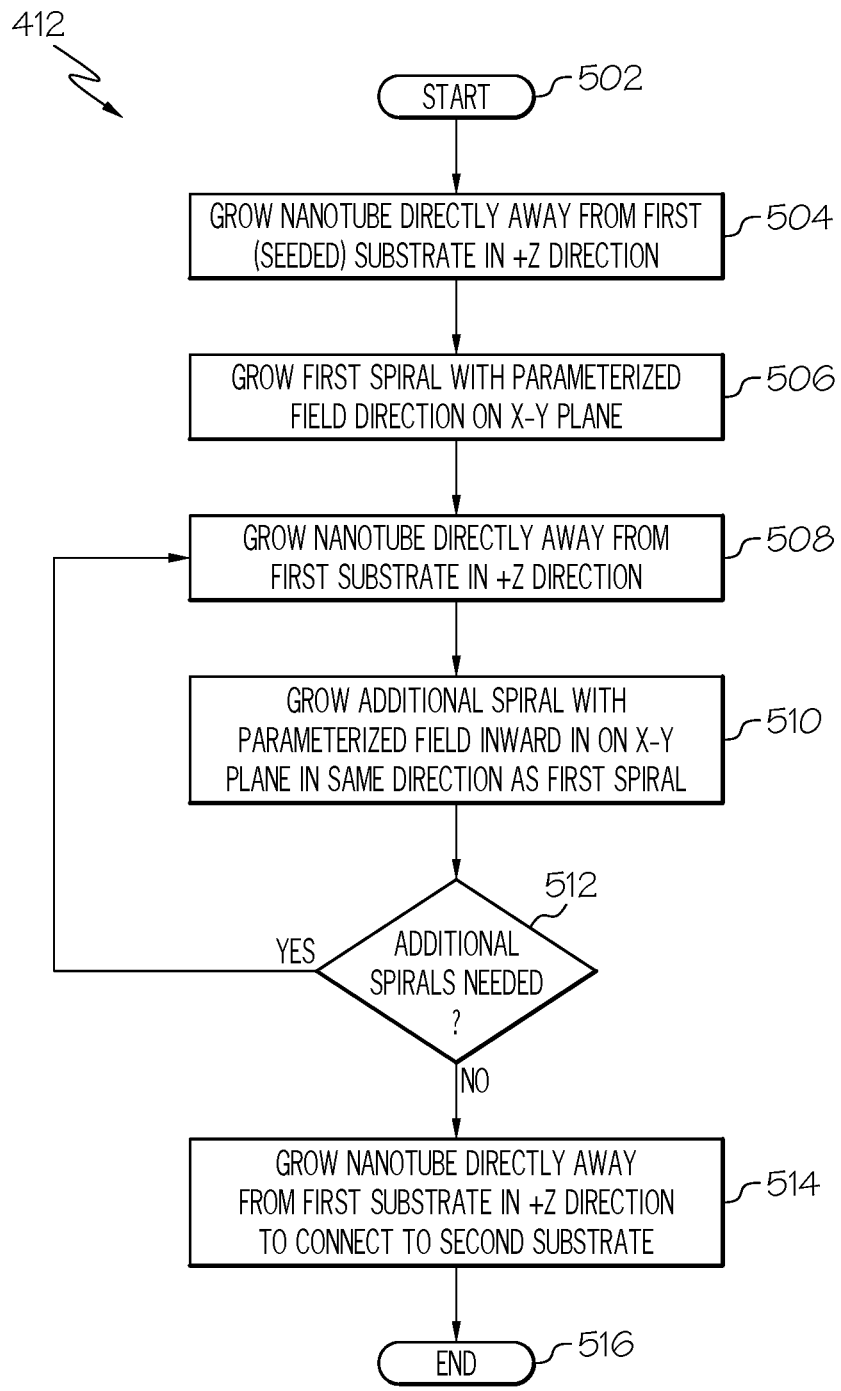
FIG. 5 is a flowchart illustrating the detail of the electric field programming portion of the method of FIG. 4.

FIG. 5 illustrates the details of sub-process 412 of FIG. 4. Sub-process 412 starts at block 502. At block 504, a nanotube is grown substantially directly away from a first substrate, which is the seeded substrate, in the +Z direction relative to previously discussed system 200. At block 506, a first spiral is grown in the x-y plane, substantially parallel to the substrate(s). At block 508, the nanotube is grown away from the substrate in the +Z direction again. An additional spiral is grown at block 510 in the same direction as the first spiral. If additional spirals are needed or desired at block 512, the growth away from the substrate followed by the growth of a spiral parallel to the substrate is repeated. Otherwise, the nanotube is grown substantially directly away from the first substrate in the +Z direction again to connect to the second substrate at block 514. Sub-process 412 then ends at block 516.

Figure 6A:
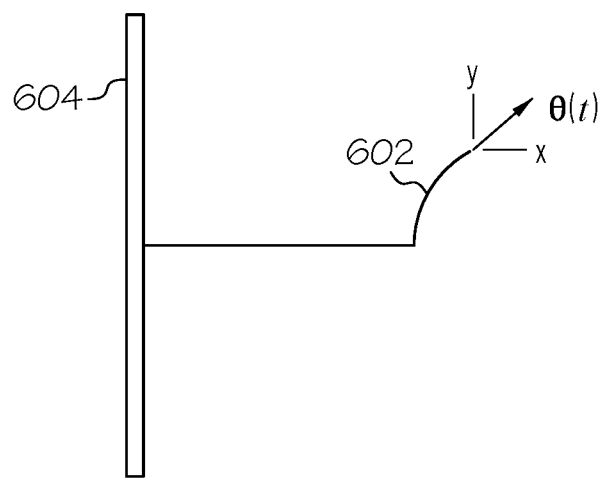
FIG. 6A and FIG. 6B show two views of a growing carbon nanotube to illustrate the parameterization of a shaped carbon nanotube according to example embodiments.
Figure 6B:
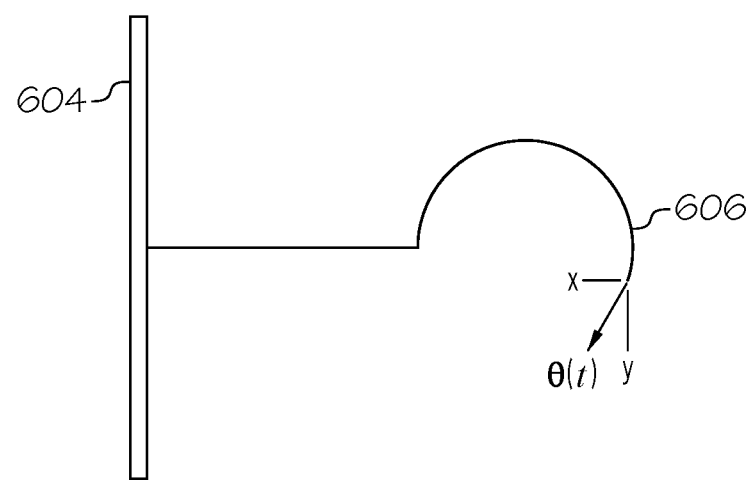

FIG. 6A and FIG. 6B show two views of a shaped CNT at two different stages of parameterized growth according to example embodiments. FIG. 6A illustrates nanotube 602 growing from substrate 604. FIG. 6B illustrates nanotube 606 growing from substrate 604. Nanotube 606 is the same nanotube as nanotube 602, but pictured later in time. By controlling the components (x, y) of electric field with respect to time, it is possible to vary or orient the direction of the electric field to the direction θ(t) in which the nanotube 602 is intended to be grown at a given moment as shown in FIG. 6A. This variation in the electric field in this example yields a predetermined shape such as a spiral nanotube 606, as shown in FIG. 6B.

Additional details of the programming sequence in example embodiments can be understood from an example implemented in Wolfram Mathematica™. The purpose of the formula programming sequence is to parameterize the desired shape of the nanotube and, using an established nanotube growth rate, parameterize the applied electric field as a function of time. The segment wherein the tube is intended to be grown directly away from the substrate (the +z direction), the electric field should be in the +Z direction with a sufficient and constant magnitude. For a segment wherein the tube is intended to be grown in a spiral, the electric field would be described by a constant magnitude but a direction that varies with time. The two components (x, y) of this field would vary in time as $A*\{\cos(\theta(t)), \sin(\theta(t))\}$, where A is a constant of sufficient strength, θ(t) indicates the direction in which the nanotube is designed to be growing at any given moment t. To ensure that the constant growth rate of the nanotube is taken into account, $r(\theta)(d\theta/dt)$ must be constant in time. An example pattern might be to start at 40 nm spiral diameter and to end at 140 nm spiral diameter after 10 loops, each loop of nanotube path is separated 10 nm from the previous course. In this case, $r(\theta)=40$ nm+10 nm*(θ/2π), the length of a turn increases with radius (and therefore time) and is approximately $2\pi r_{average}=2\pi(40$ nm+10 nm*$(\theta_{average}/2\pi))$, and for a 10 μ/min growth rate, $$\frac{\theta(t)}{2\pi} = -4 + \sqrt{4^2 + \frac{1000}{2\pi}t},$$

with t measured in minutes.

Figure 7:
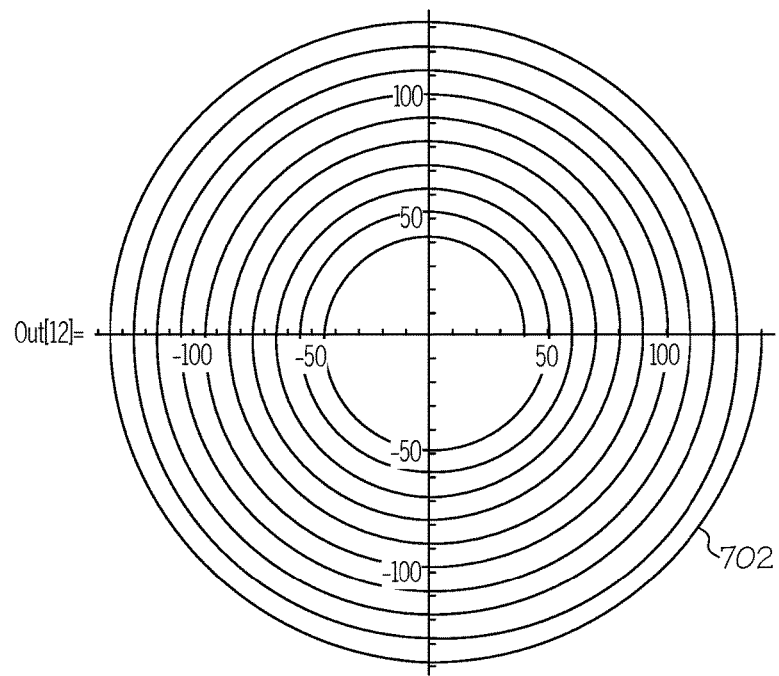
FIG. 7 is an annotated graph illustrating the growth of a spiral portion of a carbon nanotube for a mem device.

FIG. 7 shows a spiral 702 as described above plotted in Mathematica to demonstrate a formed counter-clockwise spiral. Details can be appreciated by studying legend 704 of FIG. 7. At this point, the electric field direction can be parameterized as a function of time within a plurality of segments. For instance, segment 1 grows the nanotube directly away from the substrate in the +Z direction, with a field in the +Z direction, from $t_{segment}=0$ to $t_{segment}=1$ minute. Segment 2 grows the first spiral, with a field direction in the x-y plane parameterized by $\{\cos(\theta(t)), \sin(\theta(t))\}$, with θ(t) defined in the equation above, from $t_{segment}=0$ to $t_{segment}=1.13$ minutes. Segment 3, like segment 1 grows the nanotube directly away from the substrate in the +Z direction, with a field in the +Z direction from $t_{segment}=0$ to $t_{segment}=0.3$ minutes. Segment 4 grows the second spiral in the same counter-clockwise pattern as the first, but spiraling in rather than outward, with a field direction in the x-y plane parameterized by $\{\cos(\theta(t_{final}-t)), -\sin(\theta(t_{final}-t))\}$, with θ(t) defined in the equation above, from $t_{segment}=0$ to $t_{segment}=t_{final}=1.13$ minutes. Segment 5 essentially repeats segment 3.

In example embodiments, segments 2 through 5 above are repeated 4 times to make 5 pairs of spirals, i.e. 10 spirals and segment 1 is repeated to grow the nanotube to and against the second substrate. In this example, total growth time is 15.7 minutes, total nanotube length=157 microns, and the substrate separation is between 34 and 44 microns. In most applications, there would be a desire to have tighter spirals with more loops, smaller inner diameters and larger out diameters, but the above device is somewhat simplified for clarity of illustration.

The above explains how to determine the electric field direction. The strength of the electric field should be of a magnitude to be effective for controlling the direction of growth of carbon nanotubes. In example embodiments, a field of about 0.1 V/μm has been shown to be effective. In a two-step sequence, the computer program controlling the application of the electric field is fed this parameterization and applies an electric field of a sufficient strength in the required direction as that direction varies with time.

With some minimal experimentation, the above technique alone can lead to successful mem devices. However, optionally, an additional step can be performed prior to finalizing the parameterization of the control software. If one acknowledges that the electric field is in fact a vector field, meaning its strength and direction are a function of position, it can be understood that desired field direction and magnitude must be present at the location of the tip of the nanotube. While the change in the location of the tip with time is small on a macroscopic scale, the change and the impact of the local environment on the electric field may not be negligible. It is, however, predictable, and the practitioner desiring first time success can use finite element modeling (in a program such as FEKO™ by Altair Engineering) of static electric fields in the presence of the substrates and the nanotube at its current stage of growth to refine the algorithm. Such an analysis inherently includes any dielectric polarization or other near-field effects of the substrates and the growing nanotube. This analysis will generate a convolution function whereby the user can determine the applied electrical field that will cause the desired electric field at the tip at a certain time (or stage of growth). This electric field's time evolution is what is finally fed into the control software. This sequence of steps helps ensure that the nanotube can be grown in the desired conformation with relatively little or no experimentation with actual growths.

A mem device according to example embodiments can be configured and connected in various ways. Electrodes in the form of electrical leads are present on the initial substrate to connect electrically to the catalyst particle(s). Thus a voltage can be placed across the nanotubes, and a current can be driven along the conductive carbon nanotubes. With the spiral shapes discussed herein, each CNT is a solenoid and a current through that solenoid will create a magnetic field. This magnetic field has some energy density and the net energy of the magnetic field is classically described as:

$$U_B = N^2 A I^2 l^{-1},$$

where N is the number of loops in the solenoid, A is the cross-sectional area of the solenoid, I is the current in the solenoid, and l is the length of the solenoid.

Since the net energy of the magnetic field above is inversely proportional to the length of the solenoid, energy can be minimized by increasing the length of the solenoid. While nanotubes are renowned for being stiff in their length direction, they are flexible in the other directions, which in this case allows the nanotubes to expand in the direction of the solenoid. Thus there is a force pushing two plates away from each other. In the absence of a current and a magnetic field, the nanotubes will retract to their original conformations, with some stiffness.

An individual nanotube can be fabricated between two substrates in this configuration to make a very small individual transducer, such as for use within a more complex mems device. A large array of these nanotubes connecting the same two substrates can be used as a larger transducer. A stack of such arrays, wherein the termination location on one substrate is electrically connected to a catalyst on the other side of the substrate such that another "cell" of arrays can be constructed to a third substrate, and a fourth, etc., can be used as a larger transducer with increased extent.

Generally, materials that respond to a voltage by changing length in the direction of the voltage difference are called converse piezoelectric materials. (Piezoelectric materials are ones that respond to an applied strain by generating a voltage or charge separation; converse materials go the other way and all ordinary piezoelectric materials are also converse piezoelectric materials.) The unit cell of this device is compact enough that a stack of arrays may be considered a piece of material. In this consideration, a collection of these devices comprises an artificial piezoelectric material and a device built around such material is an artificial piezoelectric device. This material and the corresponding device are anisotropic; they are capable of extending in only one direction. A voltage across any individual substrate plane will simply create a current along that substrate. The shaped carbon nanotubes within a device of this material have high aspect ratios and low bending stiffness, allowing each shaped carbon nanotube, when carrying a current, to respond to the forces on the moving electrons in that current.

Figure 8:
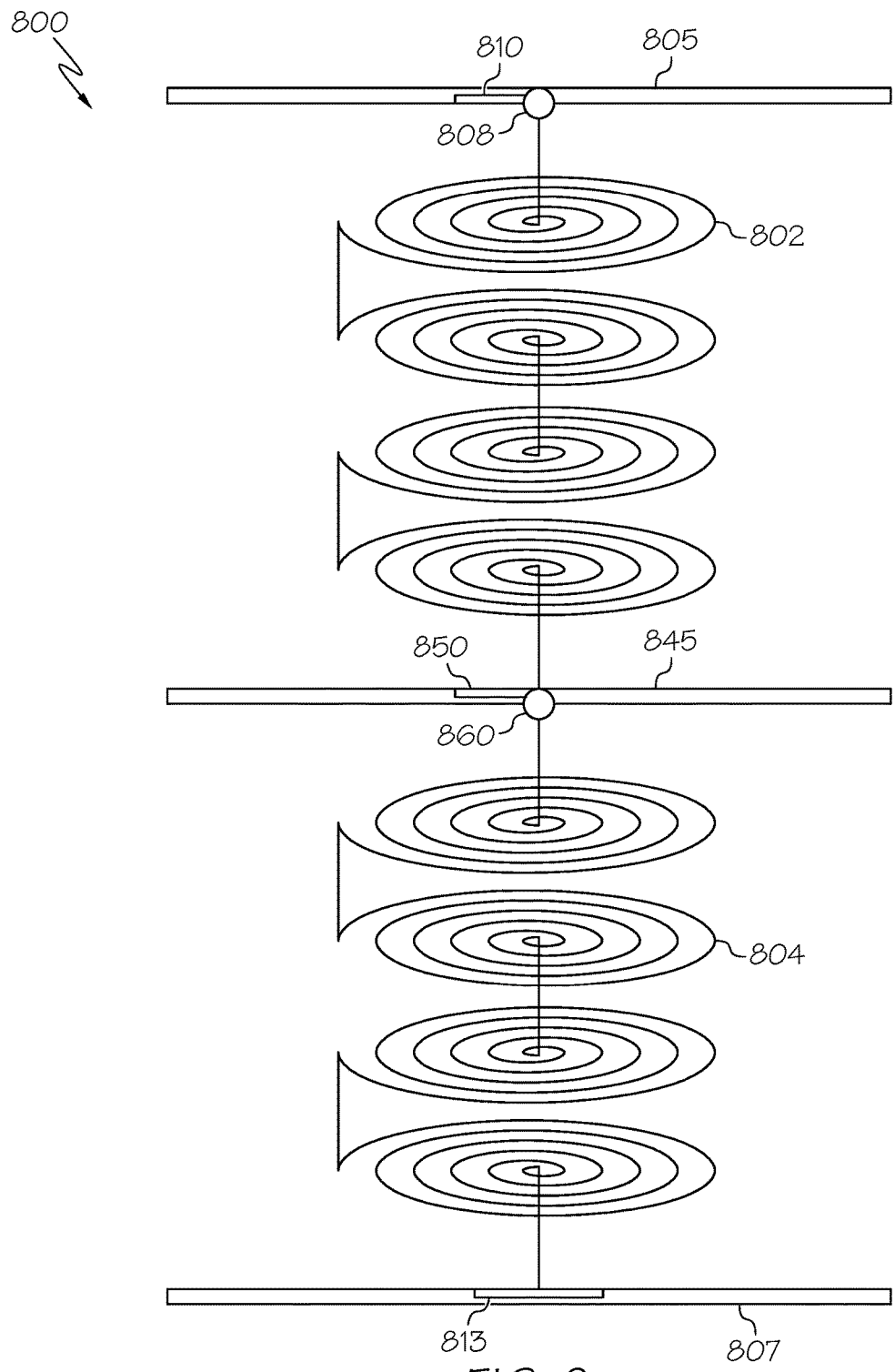
FIG. 8 is a diagram of a mem device according to additional example embodiments.

FIG. 8 illustrates a mem device according to additional embodiments. Mem device 800 includes shaped carbon nanotubes 802 and 804 connected in series between first electrode 810 and second electrode 813, which are in turn connected to first substrate 805 and second substrate 807, with catalyst 808 on the first substrate 805. Electrode 810 is rigidly attached to first substrate 805 and electrode 813 is flexibly attached to second substrate 807. The description of an electrode as "flexibly attached" generally refers to the macroscale. The electrode attached to one substrate needs to be flexible so that the second substrate can move relative to the first substrate. Thus, a stack of nanotubes is created in which the termination location on a third substrate 845, third electrode 850 is electrically connected to a catalyst 860 on the other side of the third substrate 845. Additional "cells" (not shown) can be constructed and connected to additional substrates so that the structure can be used as a larger transducer with increased extent.

Figure 9:
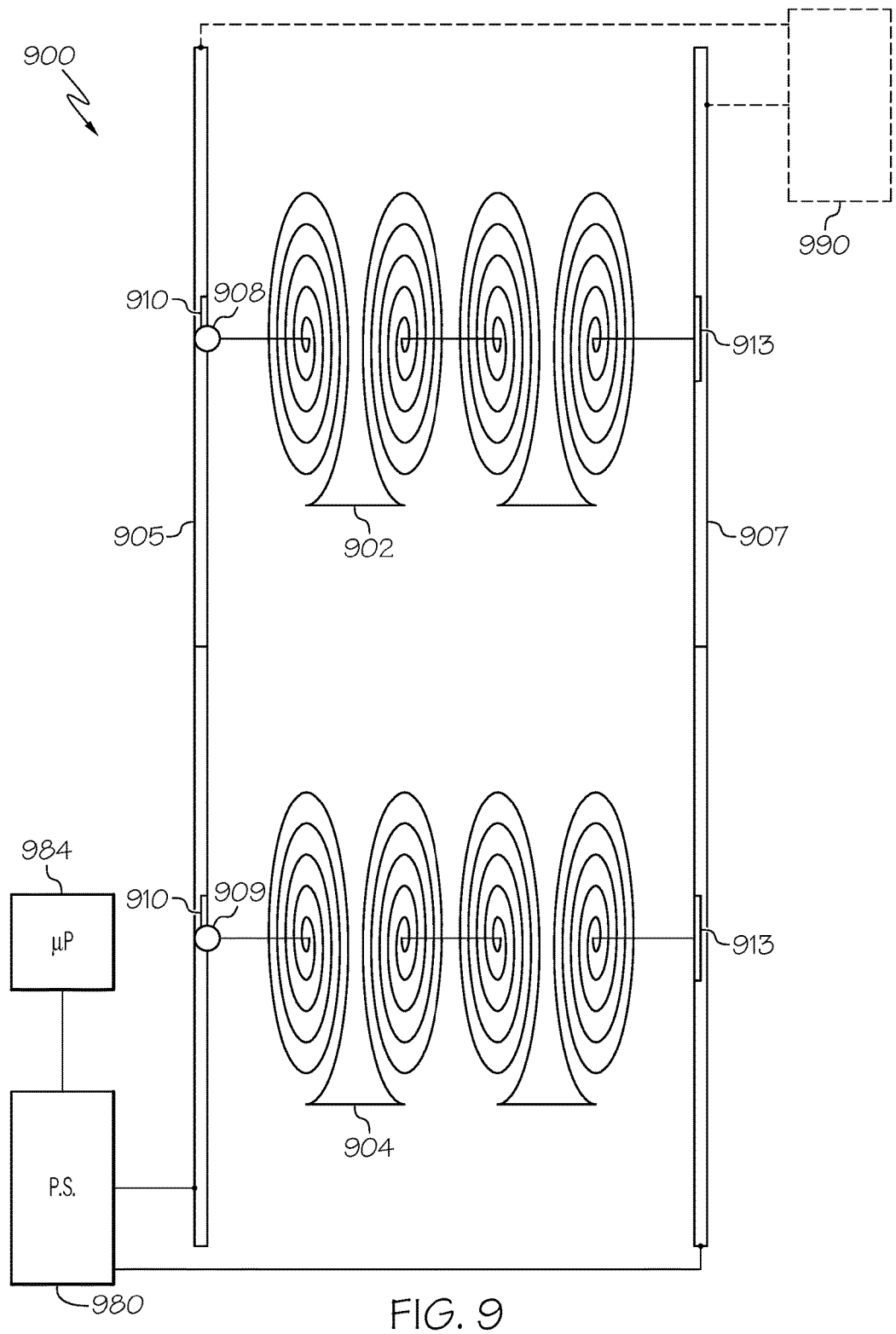
FIG. 9 is a diagram of a mem device according to yet additional example embodiments. In the case of FIG. 8, the mem device is illustrated as being used in a particular type of application.

FIG. 9 illustrates a more complete mem device 900 according to example embodiments. Mem device 900 includes a plurality of shaped carbon nanotube 902 and 904 connected in parallel between first electrodes 910 and second electrodes 913, which are in turn connected to first substrate 905 and second substrate 907, with catalysts 908 and 909 on the first substrate 905. This mem device 900 further includes appropriate electronics to make a complete, encapsulated device. Mem device 900 includes power supply 980 connected to the first electrodes 910 and the second electrodes 913, the power supply 980 being configurable to deliver an electrical current through a first electrode 910, a shaped carbon nanotube, and a second electrode 913 over a range of voltage and frequency. Mem device 900 also includes a controller 984 connected to the power supply 980 to configure and control the power supply 980. In device 900, first electrodes 910 are rigidly attached to first substrate 905 and second electrodes 912 are flexibly attached to second substrate 907.

Still referring to FIG. 9, mem device 900 optionally includes a sensor 990. This sensor 990 is connected to the first electrodes 910 and the second electrodes 913 and can be used to detect an electrical current through nanotubes 902 and 904 over a range of voltage and frequency. The sensor can be connected to controller 984, which can provide information digitally to external systems. Alternatively, the sensor can be connected to an additional processor or other circuitry external to mem device 900.

A mem device like those shown in FIG. 8 and FIG. 9 has many potential applications. As but one example, such devices can be used for active noise cancellation for optical stability of sensor systems. Some systems, including many large engines, create substantial vibrations. These vibrations must be considered when designing and placing pressure sensors, thermocouples, and other sorts of sensors. Vibration sensors can be used to feed vibration information into a controller that would apply a current to a mem device using the converse piezoelectric material discussed herein in order to perform active vibration cancellation, granting improved mechanical stability (also referred to as optical stability) to individual sensors. For such an application a single layer mem device would most likely be used, in order to reduce the impact of its size.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to embodiments of the invention in the form disclosed. Many modifications and variations will be apparent to those of ordinary skill in the art without departing from the scope and spirit of embodiments of the invention. The embodiment was chosen and described in order to best explain the principles of embodiments of the invention and the practical application, and to enable others of ordinary skill in the art to understand embodiments of the invention for various embodiments with various modifications as are suited to the particular use contemplated.

Although specific embodiments have been illustrated and described herein, those of ordinary skill in the art appreciate that any arrangement which is calculated to achieve the same purpose may be substituted for the specific embodiments shown and that embodiments of the invention have other applications in other environments. This application is intended to cover any adaptations or variations of the present invention. The following claims are in no way intended to limit the scope of embodiments of the invention to the specific embodiments described herein.

The invention claimed is:

1. A micro electromechanical (mem) device comprising:
a first substrate;
a second substrate separate from the first substrate;
a first electrode attached to the first substrate;
a second electrode attached to the second substrate; and
a shaped carbon nanotube with a first end and a second end;
wherein the first end is conductively connected to the first electrode and the second end is conductively connected to the second electrode and wherein the shaped carbon nanotube is disposed between the first substrate and the second substrate and the second substrate is movable relative to the first substrate.

2. The mem device of claim 1 further comprising:
a power supply connected to the first electrode and the second electrode, the power supply configurable to deliver an electrical current through the first electrode, the shaped carbon nanotube and the second electrode over a range of voltage and frequency; and
a controller connected to the power supply to configure and control the power supply;
wherein the first electrode is rigidly attached to the first substrate and the second electrode is flexibly attached to the second substrate so that the second substrate is movable relative to the first substrate.

3. The mem device of claim 1 further comprising:
a power supply connected to the first electrode and the second electrode;
a controller connected to the power supply; and
a sensor connected to the first electrode and the second electrode, the sensor being configured to detect an electrical current between the first electrode and the second electrode over a predetermined range of voltage and frequency;
wherein the first electrode is rigidly attached to the first substrate and the second electrode is flexibly attached to the second substrate.

4. The mem device of claim 1 wherein the shaped carbon nanotube has a shape comprising a spiral.

5. The mem device of claim 4 wherein the shaped carbon nanotube comprises a plurality of shaped carbon nanotubes connected in parallel between the first electrode and the second electrode.

6. The mem device of claim 4 wherein the shaped carbon nanotube comprises a plurality of shaped carbon nanotubes connected in series between the first electrode and the second electrode.

7. The mem device of claim 1, wherein the first electrode comprises a conductive path formed in or on the first substrate and the second electrode comprises a conductive path formed in or on the second substrate.

8. The mem device of claim 1, further comprising:
a third substrate;
a third electrode attached to the third substrate; and
wherein the shaped carbon nanotube comprises a first shaped carbon nanotube conductively connected between the first electrode and the second electrode and a second shaped carbon nanotube conductively connected between the second electrode and the third electrode.

9. The mem device of claim 8, wherein the mem device is configured for active noise cancellation.

10. The mem device of claim 1, further comprising:
a third substrate;
a third electrode attached to the third substrate; and
wherein the shaped carbon nanotube comprises a first plurality of shaped carbon nanotubes conductively connected in series between the first electrode and the second electrode and a second plurality of shaped carbon nanotube conductively connected in series between the second electrode and the third electrode.

11. The mem device of claim 1, wherein the shaped carbon nanotube comprises:
a first plurality of shaped carbon nanotubes conductively connected in series between the first electrode and the second electrode; and
a second plurality of shaped carbon nanotubes conductively connected in series between the first electrode and the second electrode, wherein the first plurality of shaped carbon nanotubes is connected in parallel with the second plurality of shaped carbon nanotubes between the first substrate and the second substrate.

12. The mem device of claim 11, further comprising:
a power supply connected to the first electrode and the second electrode; and
a controller connected to the power supply, wherein the controller is configured to receive vibration information from a vibration sensor and apply a current to the mem device to perform active vibration cancellation.

13. The mem device of claim 11, further comprising:
a power supply connected to the first electrode and the second electrode;
a controller connected to the power supply; and
a sensor connected to the first electrode and the second electrode, the sensor being configured to detect an electrical current between the first electrode and the second electrode over a predetermined range of voltage and frequency;
wherein the first electrode is rigidly attached to the first substrate and the second electrode is flexibly attached to the second substrate so that the second substrate is movable relative to the first substrate.

14. The mem device of claim 1, wherein the shaped carbon nanotube is grown from one or more catalyst particles in a furnace, the furnace comprising a growth region for carbon nanotubes and the furnace being configured to permit establishment of a controlled, time-varying electric field within the growth region.

15. The mem device of claim 1, wherein the mem device is produced by a system, the system comprising:
a furnace including a growth region for carbon nanotubes, the furnace being configured to permit establishment of a controlled, time-varying electric field within the growth region;
a plurality of electrodes placed outside the growth region to produce the controlled, time-varying electric field;
a power supply connected to the plurality of electrodes; and
a controller connected to the power supply to control the power supply to deliver controlled voltages to the electrodes to cause the electrodes to produce the controlled time-varying electric field.

16. The mem device of claim 15, wherein the plurality of electrodes further comprises three electrode pairs positioned and aligned to produce the time-varying electric field comprising three independent, orthogonal, time-varying electric fields.

17. The mem device of claim 16, wherein the furnace is configured to allow passage of gasses into and out of the growth region to enable chemical vapor deposition (CVD) growth of the carbon nanotubes.

18. The mem device of claim 17, wherein the furnace comprises a tube furnace.

19. The mem device of claim 18, wherein the three electrode pairs further comprise:
- a first electrode pair further comprising two electrodes parallel to an axis of the tube furnace and centered above and below the growth region;
- a second electrode pair further comprising two electrodes parallel to each other placed in front of and in back of the growth region, between the two electrodes of the first electrode pair, and at an angle relative to the axis of the tube furnace; and
- a third electrode pair further comprising two electrodes parallel to each other placed in front of and in back of the growth region, between the two electrodes of the first electrode pair, at an angle relative to the axis of the tube furnace, and at an angle relative to the two electrodes of the second electrode pair.

20. The mem device of claim 19, wherein a mixture of gasses is passed through the furnace, the mixture of gasses is tailored to cause chemical vapor deposition (CVD) of carbon on a catalyst.

21. The mem device of claim 20, wherein a time-varying electric field is controlled within the growth region to parameterize a growing nanotube into a predetermined shape.

22. The mem device of claim 21, wherein the predetermined shape comprises a spiral.

* * * * *